United States Patent
Sprey et al.

(10) Patent No.: US 6,884,317 B2
(45) Date of Patent: Apr. 26, 2005

(54) METHOD AND INSTALLATION FOR ETCHING A SUBSTRATE

(75) Inventors: Hessel Sprey, Leuven (BE); Arjen Benjamin Storm, Leuven (BE); Jan Willem Hubert Maes, Heverlee (BE)

(73) Assignee: ASM International, N.V., Bilthoven (NL)

(*) Notice: Subject to any disclaimer, the term of this patent is extended or adjusted under 35 U.S.C. 154(b) by 95 days.

(21) Appl. No.: 09/771,673

(22) Filed: Jan. 29, 2001

(65) Prior Publication Data

US 2001/0015343 A1 Aug. 23, 2001

Related U.S. Application Data

(63) Continuation-in-part of application No. PCT/NL99/00487, filed on Jul. 29, 1999, now abandoned.

(30) Foreign Application Priority Data

Jul. 29, 1998 (NL) .............................................. 1009767

(51) Int. Cl.[7] .......................... B44C 1/22; C03C 15/00; C03C 25/06
(52) U.S. Cl. ............................ 156/345.35; 156/345.38; 156/345.11; 156/345.33; 156/345.23; 134/113
(58) Field of Search ..................... 134/114; 156/345.23, 156/345.11, 345.3, 345.29; 451/66

(56) References Cited

U.S. PATENT DOCUMENTS

| | | | |
|---|---|---|---|
| 5,022,961 A | | 6/1991 | Izumi et al. |
| 5,879,459 A | | 3/1999 | Gadgil et al. |
| 6,162,323 A | * | 12/2000 | Koshimizu ............. 156/345.26 |
| 6,333,275 B1 | * | 12/2001 | Mayer et al. ................ 438/745 |
| 6,432,255 B1 | * | 8/2002 | Sun et al. ................. 118/723 E |

FOREIGN PATENT DOCUMENTS

| | | |
|---|---|---|
| EP | 0 335 313 | 10/1989 |
| WO | WO 87/01508 | 3/1987 |
| WO | WO 94/27315 | 11/1994 |

* cited by examiner

Primary Examiner—Gregory Mills
Assistant Examiner—Sylvia R. MacArthur
(74) Attorney, Agent, or Firm—Knobbe, Martens, Olson & Bear, LLP

(57) ABSTRACT

Method for etching a substrate wherein, after placing in an etching chamber, said substrate is treated with a mixture of HF and acetic acid. Acetic acid is introduced into the chamber first, followed by the hydrogen fluoride. Hydrogen fluoride is introduced via an intermediate stage during which the hydrogen fluoride is stored in an auxiliary chamber. By this means back-flow of a corrosive mixture consisting of hydrogen fluoride and acetic acid into the piping assembly for hydrogen fluoride is prevented and, thus, the life of the piping assembly concerned is appreciably prolonged and metal contamination on substrate treated later is prevented.

19 Claims, 1 Drawing Sheet

METHOD AND INSTALLATION FOR ETCHING A SUBSTRATE

This application is a continuation-in-part of International Application No. PCT/NL99/00487, filed Jul. 29, 1999 and now abandoned, which claims priority to Dutch Application No. NL 1009767, filed on Jul. 29, 1998.

FIELD OF THE INVENTION

The present invention relates to a method and installation for etching a substrate.

BACKGROUND OF THE INVENTION

A method this type is known from EP 0.335.313-A-2. For etching silicon dioxide on the surface of semiconductor substrates, such a substrate is placed in a plastic-lined stainless steel etching chamber and then treated, if appropriate under reduced pressure, with a corrosive mixture of acetic acid, water or methanol (preferably 100%) and hydrogen fluoride. The chamber is first filled with the requisite amount of acetic acid, the requisite amount of hydrogen fluoride then being introduced. The various sources or feeds of hydrogen fluoride and acetic acid are each closable by means of valves. The piping system is made either of stainless steel or of plastic, such as perfluoroalkoxy (PFA).

Although a method of this type yields excellent etching results, there is the problem that, when the hydrogen fluoride shut-off valve is opened, on the one hand hydrogen fluoride flows into the etching chamber, but some acetic acid inevitably diffuses back via said shut-off valve into the piping system for HF. Such an amount is found to be very small in practice and not to have an adverse effect on the rate of etching, but it has been found that the upstream stainless steel piping system as a result is attacked as far as the BF source and that this can result in undesirable metal contaminants on the semiconductor substrate in subsequent etching operations.

This means that it is sometimes necessary to replace such a piping system and that in any event it is necessary to subject such a piping system to a regular check.

Both operations impede the process operation and are disadvantageous.

In EP 0.335.313-A-2 mentioned above, a method and device are described, wherein two etch gases from a ft and a second source are being supplied through a common conduit to an auxiliary chamber. In this auxiliary chamber a plasma is generated and this is transferred to the reactor. The etching gases used are $CF_4$ and $O_2$. It is of importance that both gases are being supplied simultaneously and preferably continuously from the source through the auxiliary chamber to the process chamber.

Such a method does not give a solution for the problem mentioned above i.e. the aggressively of a mixture of HF and another etchant and/or catalyst such as acetic acid, formic acid or water.

SUMMARY OF THE INVENTION

The aim of the present invention is to circumvent this disadvantage and to provide a method which can be carried out continuously without ongoing checks and/or replacement of the piping being necessary.

One aspect of the present invention involves a method for etching a substrate. A substrate is placed in an etching chamber and at least one of a first etchant and a first etch catalyst originating from a first source is introduced into the etching chamber via an auxiliary chamber positioned within a first path. The introducing includes intermittently closing an inlet of the auxiliary chamber after introduction of the at least one of a first etchant and a first etch catalyst. The outlet of the auxiliary chamber is opened to discharge the at least one of a first etchant and a first etch catalyst into the etching chamber so that the inlet is closed when the outlet is opened. At least one of a second etchant and a second etch catalyst originating from a second source is introduced into the etching chamber via a second path. The substrate is etched and the etching chamber is flushed following the etching. The substrate is then removed from the etching chamber.

It is true that as a result of the use of an auxiliary chamber it is possible that when the outlet from the auxiliary chamber to the etching chamber is opened the other reactant, such as acetic acid, diffuses back into said auxiliary chamber, but this reactant is not able to diffuse back into the piping system for said one reactant, such as hydrogen fluoride. After all, the auxiliary chamber is closed off on that side. By removing both reactants from the auxiliary chamber (and the thing cab) before the next process, further back-diffusion in the direction of the HF feed can be precluded. It has been found that there is no attack on the upstream piping.

Consequently, it is possible to construct only the piping system from the auxiliary chamber to the etching chamber from relatively expensive plastic, but to construct the upstream part of the piping system with respect to the auxiliary chamber from inexpensive stainless steel material. This applies in particular if a 'mass flow controller' is used, which is not obtainable in plastic.

Back-diffusion can be completely precluded if, according to a preferred embodiment of the invention, following treatment in the etching chamber flushing is carried out via the auxiliary chamber. After closing the auxiliary chamber outlet valve, an elevated gas pressure can be applied in the auxiliary via the inlet valve using nitrogen or another inert gas, and the auxiliary chamber can be flushed with the aid of said nitrogen, back-diffusion being precluded. With this arrangement it is possible to use the auxiliary chamber as a lock, at least during the initial phase, when flushing with nitrogen as well, that is to say first to admit nitrogen into the chamber, to close the auxiliary chamber inlet and then to open the outlet to the etching chamber.

According to another possibility, a vacuum can be applied to both the auxiliary chamber and the etching chamber, followed by one or more flushing operations with an inert gas, such as nitrogen. It is possible to apply a vacuum to the auxiliary chamber and etching chamber, optionally followed by one or more flushing operations with nitrogen.

The invention is described above and below by way of example with reference to the etching of a semiconductor substrate with hydrogen fluoride and acetic acid, flushing being carried out with nitrogen. It will be understood that the present invention can be applied for etching or otherwise treating any other substrate with any other treatments where it is necessary that at least two reactants are present which are supplied from two different sources and can be mixed only at the time of the reaction.

According to a further advantageous embodiment of the invention, there is a bypass line around the auxiliary chamber. By this means a stable flow of hydrogen fluoride, on its own or mixed with nitrogen, is established, so that the amount of reactant which is briefly introduced into the auxiliary chamber can be metered using accurate time control.

According to an advantageous embodiment, it is possible to place an absorbent for the other reactant in the auxiliary chamber. If this other reactant is acetic acid, such an absorption volume could contain silicon.

Generally during an etch treatment wherein nitrogen fluoride is added as first etchant or reagens, first a second etchant and/or catalyst can be supplied to the etch chamber to pretreat the surface of the substrate. Only then hydrogen fluoride is added.

The invention also relates to an installation for carrying out the method described above. This installation comprises an installation for etching a substrate, comprising an etching chamber provided with an entry/exit opt for said substrate, an inlet/discharge opening for reactants connected to a piping system for the separate supply of at least two reactants, one feed comprising an auxiliary chamber provided with an inlet and outlet, each having a shutoff valve, the outlet being connected to the etching chamber and the inlet to the reactant feed.

According to an advantageous embodiment of the invention, the etching chamber is no longer constructed from a plastic-lined metal material, as in the prior art, but is made entirely of plastic. That is to say the plastic also takes the (reduced) pressures prevailing in the etching chamber. It has been found that there is still always a certain degree of porosity when steel is lined with plastic, whilst sealing the various parts constitutes a problem as a result of which attack takes place in the longer term. Moreover, the processing of such lined steel sheets is relatively expensive and it has been found that production from solid plastic components is less expensive and reduces such porosity, whilst no attack has been observed, so that regular checking of the various components is also not necessary.

Examples of plastics which may be mentioned are polyvinylidene fluoride, polypropylene, perfluoroalkoxy and polytetrafluoroethene. It must be understood that use of such a chamber made of plastic is not restricted to combination with the method described above, that is to say the invention also comprise use of plastic etching chambers in combination with the method and installation according to the prior art, that is to say not provided with the auxiliary chamber described above. It has been found that the plastic material has adequate strength even under reduced pressure and there is no risk of implosion. Moreover, it has been found that in contrast to prejudices existing in the prior art, gassing does not constitute a substantial problem, especially when reduced pressure is used.

It must be understood that the use, described above, of an etching chamber where the plastic is a structural component, that is to say is exposed to the pressure, can also be used in other systems without the use of the auxiliary chamber described above. Rights are explicitly claimed for such an application.

BRIEF DESCRIPTION OF THE DRAWINGS

The invention will be explained in more detail below with reference to an illustrative embodiment shown in the drawing. In the drawing.

DETAILED DESCRIPTION OF THE INVENTION

Figure 1:
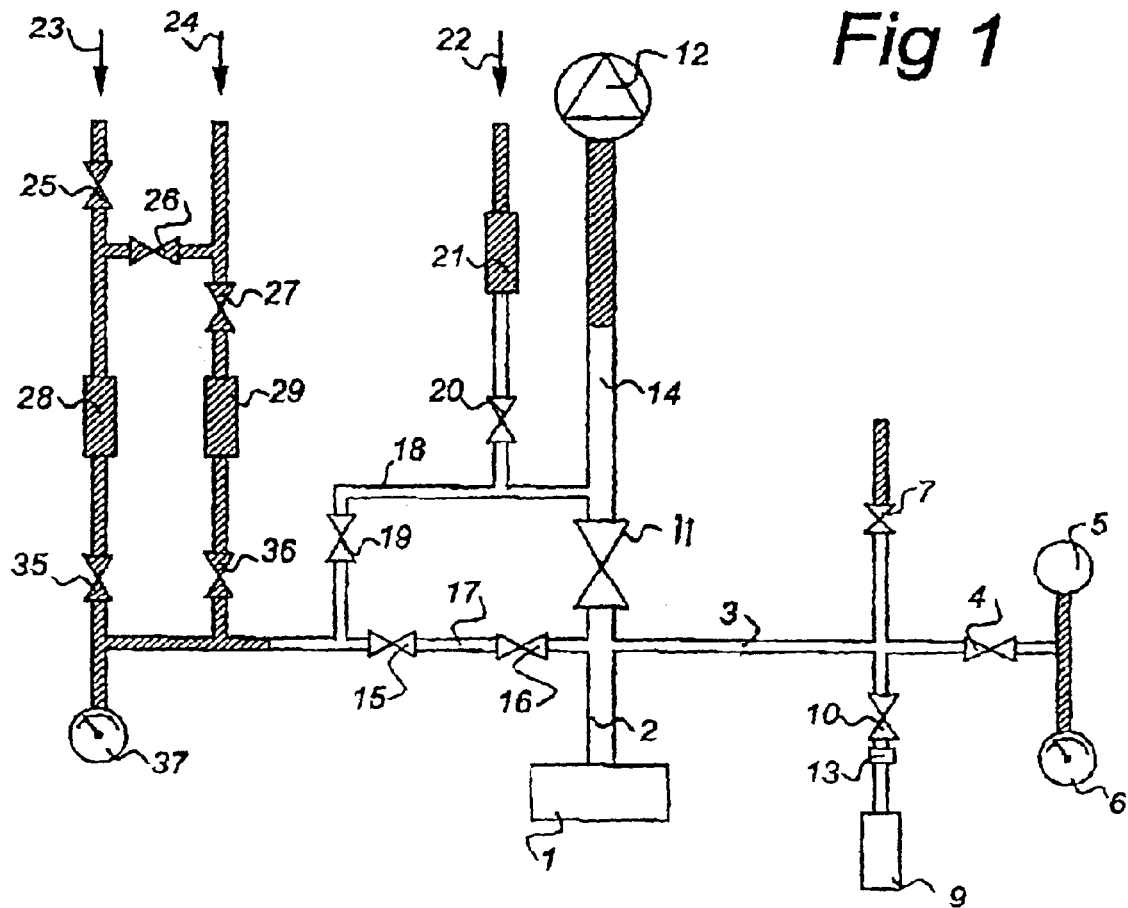
FIG. 1 shows, diagrammatically, the piping system according to the invention with the etching chamber accommodated therein.

In FIG. 1 an etching chamber into which the substrate to be treated is placed is shown diagrammatically by 1. The etching chamber is provided with a connection 2 to various lines. One line is indicated by 3 and terminates at three valves 4, 7 and 10. Valve 4 provides the connection to a pressure switch 5 and a pressure gauge 6. Valve 7 is a safety valve, that is to say an overpressure valve which is connected to the discharge system of the installation.

A feed for 100% acetic acid is indicated by 9.

Acetic acid is contained in a glass bottle 9 and is connected to shut-off valve 10 via a throttle opening 13.

Etching chamber 1 is also connected to a valve 11. The latter is, in turn, connected to a vacuum pump 12. The latter is able, for example, to generate a vacuum of 100 mtorr.

Connection 2 is additionally connected to outlet valve 16 of an auxiliary chamber 17. The inlet valve thereof is indicated by 15. This auxiliary chamber is provided with a bypass line 18 in which a valve 19 is fitted and which opens into line 14 downstream of valve 11. Bypass lie 18 is also provided with a branch in which a valve 20 and a flow controller 21 made of metallic material are fitted. This flow controller 21 is connected to a nitrogen source which is indicated diagrammatically by arrow 22.

The inlet 15 of the auxiliary chamber 17 is connected to a feed for nitrogen and hydrogen fluoride. The nitrogen feed consists of a source 23 and the hydrogen fluoride feed of a source 24. Valves 25, 27 are actuated downstream of said feeds, whilst said feeds can be connected to one another via a valve 26. Flow controllers 28 and 29 made of stainless steel are fitted in the feed lines, as well as valves 35 and 36. A pressure gauge 37 is also fitted. The valves mentioned in this description as well as other parts are controlled through a controller not shown.

In FIG. 1 parts made of plastic material are indicated by '—', whist parts made of stainless steel are shown by '///'.

The plastic material used can be, for example, PFA.

Figure 2:
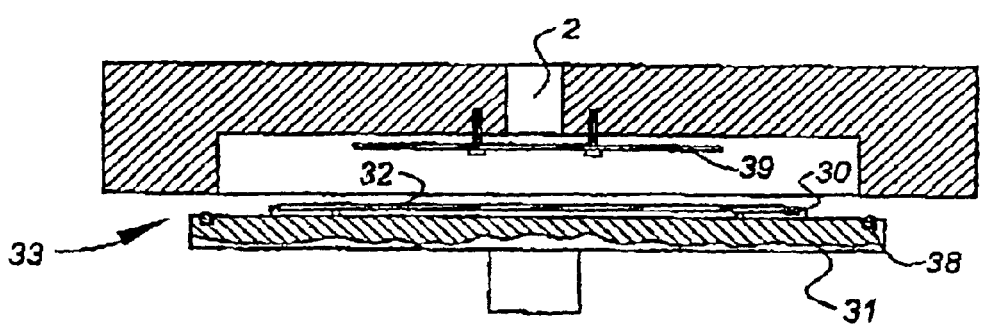
FIG. 2 shows an example of an etching chamber which can be used with the invention.

FIG. 2 shows an example of an etching chamber 1. This etching chamber is provided with a entry plate 31 which can be moved up and down, in a manner which is not shown in more detail, in order to expose an opening 30 for the introduction of a substrate, such as a semiconductor wafer 32, in the direction of arrow 33 and, in turn, for removal of said substrate from said chamber after treatment. A ring seal 38 is fitted. 39 indicates a flow distributor plate for distributing the gas flow from line 2 uniformly over the semiconductor substrate 32.

In order to achieve that the etching chamber, made of plastic material can resist the outside pressure while processing at reduced pressure, the etching chamber comprises two main parts which are each made in its entirety out of a massive block of plastic material such that a main part does not comprise a weld. Further, care is taken that the wall thickness of the main parts is about 20 mm or more and more preferably about 40 mm or more. Finally, the main parts seal against each other employing sealing means such as an O-ring seal or a lip seal. The preferred number of main parts is two, but three or more constituent main parts are possible in alternative designs, as motivated by ease of manufacturing or other reasons.

The installation described above functions as follows:

After introducing a semiconductor substrate or wafer 32 into etching chamber 1 in accordance with arrow 33, entry plate 31 is closed with the shut-off valves, 7, 10, 15, 19 and 20 closed, pump 12 is switched on with shut-off valves 11 and 16 open (for pumping out auxiliary chamber 17). By this means a vacuum is generated in etching chamber 1 and auxiliary chamber 17 and, with off valve 4 open, the reading can be read off on pressure gauge 5 and recorded electrically using pressure switch 6.

If an adequate vacuum has been generated in etching chamber 1 and auxiliary chamber 17, shut-off valves 11 and 16 are closed. Shut-off valve 10 is then opened and acetic acid flows, in an accurately time-controlled manner, via restriction 13 into etching chamber 1. Providing said restriction enables control as a function of time, in order to achieve optimum metering. During or prior to the introduction of acetic add, auxiliary chamber 17 is filled with hydrogen fluoride originating from source 24. For filing auxiliary chamber 17, a stable hydrogen fluoride flow is first established. This is effected by allowing the hydrogen fluoride stream to flow via bypass line 18, with shut-off valve 19 open, to pump 12. As soon as a stable flow has been established, inlet 15 is opened (shut-off valve 19 closed) with outlet 16 closed and chamber 17 is filled, after which inlet 15 is closed. In the interim the etching chamber has been adequately filled with acetic acid and shut-off valve 10 is closed. Shut-off valve 4 is likewise closed. Shut-off valve 16 is then opened and, because the pressure in auxiliary chamber 17 is higher than the pressure in etching chamber 1, hydrogen fluoride will pass into etching chamber 1. It is possible that slight back-diffusion of acetic acid into auxiliary chamber 17 tales place, but this material is not able to diffuse further. Because the auxiliary chamber is constructed of resistant plastic material, no attack on the components is located therein can take place.

After etching is complete, shut-off valve 11 is opened, with outlet 16 open, and pump 12 is switched on and the mixture present in the etching chamber and auxiliary chamber is pumped out. Nitrogen originating from source 23 can optionally be admixed by opening shut-off valve 19. As a result the concentration of aggressive medium becomes so low that attack on the pump and other components located downstream is not to be feared. With valve 11 closed, the auxiliary chamber 17 and etching chamber 1 are then filled with nitrogen by opening inlet 15 and outlet 16, 25, 28, 35. By then closing inlet 15 and opening valve 11, both chambers can be evacuated again. This flushing treatment can be repeated several times.

It is possible to allow pump 12 to run continuously. During etching there will then be no gas passing through said pump 12, as a consequence of which the drawback of oil diffusing back could possibly rise. In order to prevent this, shut-off valve 20 is opened and a quantity of nitrogen originating from source 22, which quantity is controlled via flow controller 21, is discharged through pump 12.

It will be understood that with the aid of the flow controllers 28 and 29 accurate metering of both nitrogen and hydrogen fluoride can take place.

A few values for the method described above may be mentioned by way of example. If the etching chamber has a volume of 1 liter, the auxiliary chamber can have a volume of approximately 30 cm$^3$. After feeding acetic acid into the etching chamber 1, the pressure is approximately 500 to 1000 Pa. Acetic acid can, for example, be supplied for 5 sec. in order to provide the correct dosage.

Although the invention has been described with reference to a preferred embodiment, numerous variants are possible. For instance, it is possible to install a further auxiliary chamber connected downstream of the first auxiliary member. It is also possible to introduce an absorbent volume into the auxiliary chamber 17. This absorbent volume is capable of absorbing the small quantity of INIT which diffuses back via outlet 16 and thus to prevent further diffusion after closure of auxiliary chamber 17 by means of inlet 15. An absorbent volume of this type can consist of a part silicon material. In this way, it is possible to carry out the process with an aqueous solution of HF. If, for example, an azeotropic mixture of 39% HF in water is used, the vapour has the same composition as the liquid and the composition of the liquid remains constant over time. Metering of this vapour is comparable to the metering of acetic acid and no longer has to take place via a flow controller, as described above, but can be realised via a restriction and/or can be controlled as a function of time and/or pressure. With an embodiment of this type the auxiliary chamber has to have a larger volume because the maximum vapour pressure is substantially lower than that of anhydrous HF. In such a case, all lines must be made of plastic because such an H$_2$O/HF mixture is much more corrosive than HF without the presence of water. The auxiliary chamber is then important in order to prevent mixing of two reagents and to keep the composition constant.

These and further modifications are obvious to those skilled in the art after reading the above within the of the appended claims.

What is claimed is:

1. An installation for etching a substrate by simultaneous exposure to two etching gases, the two etching gases forming a corrosive mixture, the installation, comprising:
   an etching chamber for a substrate, the etching chamber having an opening;
   a piping system coupled to the opening and providing for at least a first fluid feed and a second fluid feed, wherein the first fluid feed is connected at a source end to a source of a first etching gas, wherein the second fluid feed is connected at a source end to a source of a second etching gas, and wherein the first and second fluid feeds are configured to separately provide the first and second etching gases to the etching chamber via the piping system;
   an auxiliary chamber positioned within the piping system and having an inlet and an outlet, wherein the inlet includes a first controllable shut-off valve and is in communication with the first fluid feed, wherein the outlet includes a second controllable shut-off valve and is in communication with the etching chamber, and wherein said first and second shut-off valves are configured to be open only one at a time; and
   a third controllable shut-off valve positioned in the piping system in the second fluid feed, wherein the third shut-off valve and the second shut-off valve are configured to be open only one at a time,
   wherein the walls of auxiliary chamber and the walls of piping system upstream of the auxiliary chamber are each formed of different materials.

2. The installation of claim 1, wherein the piping system includes a bypass line for bypassing said auxiliary chamber.

3. The installation of claim 1, wherein said etching chamber is connected to a vacuum pump.

4. The installation of claim 1, wherein the piping system includes a valve coupled to the second fluid feed.

5. The installation of claim 1, wherein said etching chamber is of a plastic material and is configured to withstand a reduced pressure in said etching chamber.

6. The installation of claim 5, wherein said plastic material comprises polyvinylidene fluoride.

7. The installation of claim 1, wherein the first etching gas comprises hydrogen fluoride.

8. The installation of claim 7, wherein the second etching gas is a catalyst for hydrogen fluoride etching.

9. The installation of claim 8, wherein the second etching gas is selected from the group consisting of acetic acid, formic acid and water.

10. The installation of claim 9, wherein the second etching gas comprises acetic acid.

11. The installation of claim 1, wherein the auxiliary chamber is formed of a material having higher corrosion resistance to a mixture of the first and the second etching gases than an other material forming the piping system.

12. The installation of claim 1, wherein the auxiliary chamber is formed of plastic.

13. The installation of claim 12, wherein the piping system upstream of the auxiliary chamber is formed of stainless steel.

14. A system for etching a substrate, comprising:

an etching chamber for the substrate;

a piping system in fluid communication with the etching chamber and having at least a first fluid feed and a second fluid feed, wherein the first fluid feed is connected at a source end to a source of a first etching gas, wherein the second fluid feed is connected at a source end to a source of a second etching gas;

an auxiliary chamber positioned within the piping system and having an inlet and an outlet, wherein the inlet includes a first controllable shut-off valve and is in gas communication with the first fluid feed and the outlet includes a second controllable shut-off valve and is in gas communication with the etching chamber;

a third controllable shut-off valve positioned in the piping system in the second fluid feed;

means for preventing diffusion of the second etching gas through the inlet of the auxiliary chamber by opening the first and second shut-off valves only one at a time and by opening the second and the third shut-off valves only one at a time: and wherein walls of the auxiliary chamber and walls of the piping system upstream of the auxiliary chamber are each formed of different materials.

15. The system of claim 14, wherein a material forming a part of the piping system from the auxiliary chamber to the etching chamber has a higher resistance to corrosion by a mixture of the first and the second etching gases than an other material forming another part of the piping system upstream of the auxiliary chamber.

16. The system of claim 15, wherein the material forming a part of the piping system from the auxiliary chamber to the etching chamber is a plastic material.

17. The system of claim 16, wherein the other material forming another part of the piping system upstream of the auxiliary chamber a stainless steel material.

18. The system of claim 14, wherein the first etching gas comprises hydrogen fluoride.

19. The system of claim 18, wherein the second etching gas is selected from the group consisting of acetic acid, formic acid and water.

* * * * *

UNITED STATES PATENT AND TRADEMARK OFFICE
CERTIFICATE OF CORRECTION

PATENT NO. : 6,884,317 B2
DATED : April 26, 2005
INVENTOR(S) : Hessel Sprey, Arjen Benjami Storm and Jan Willem Hub Maes It is certified that error appears in the above-identified patent and that said Letters Patent is hereby corrected as shown below:

Column 1,
Line 15, after "method" insert -- of --.
Line 35, delete "BF" and insert -- HF --, therefor.
Line 46, delete "ft" and insert -- first --, therefor.
Line 51, after "both" insert -- etching --.

Column 2,
Lines 19-20, delete "thing cab" and insert -- etching chamber --, therefor.
Line 36, after "auxiliary" insert -- chamber --.
Line 36 after "valve" insert -- , --.
Line 55, delete "treatments" and insert -- reactants --, therefor.

Column 3,
Line 11, delete "opt" and insert -- opening --, therefor.
Line 15, delete "shutoff" and insert -- shut-off --, therefor.
Line 25, after "problem", insert -- , --.
Line 38, delete "comprise" and insert -- comprises --, therefor.
Line 43, after "that" insert -- , --.

Column 4,
Line 18, delete "lie" and insert -- line --, therefor.
Line 21, after "source", insert -- , --.
Line 44, after "flow", insert -- issuing --.
Line 48, after "material" insert -- , --.
Line 63, after "closed", delete "with" and insert -- . With --, therefor.
Line 67, delete "off" and insert -- shut-off --, therefor.

Column 5
Line 10, delete "add" and insert -- acid --, therefor.
Line 11, delete "filing" and insert -- filling --, therefor.
Line 17, after "and" insert -- auxiliary --.
Line 25, delete "tales" and insert -- takes --, therefor.
Line 27, after "components" delete "is".
Line 45, delete "rise" and insert -- arise --, therefor.
Lines 63-64, delete "member" and insert -- chamber --, therefor.

UNITED STATES PATENT AND TRADEMARK OFFICE
CERTIFICATE OF CORRECTION

PATENT NO. : 6,884,317 B2
DATED : April 26, 2005
INVENTOR(S) : Hessel Sprey, Arjen Benjami Storm and Jan Willem Hub Maes It is certified that error appears in the above-identified patent and that said Letters Patent is hereby corrected as shown below:

Column 6,
Line 20, insert -- scope -- before "of".
Line 50, between "walls of" and "auxiliary" insert -- the --.
Line 50, at the end of the line after "walls of" insert -- the --.

Column 8,
Line 8, after "time" delete ":" and insert -- ; --, therefor.

Signed and Sealed this

Twenty-fifth Day of October, 2005

JON W. DUDAS
*Director of the United States Patent and Trademark Office*